United States Patent [19]

Kornrumpf et al.

[11] 4,310,837

[45] Jan. 12, 1982

[54] ELECTRICAL DEVICE TERMINATION HIGH TEMPERATURE INDICATOR

[75] Inventors: William P. Kornrumpf; John D. Harnden, Jr., both of Schenectady, N.Y.

[73] Assignee: General Electric Company, Schenectady, N.Y.

[21] Appl. No.: 196,457

[22] Filed: Oct. 14, 1980

[51] Int. Cl.³ .............................................. G08B 17/06
[52] U.S. Cl. .................................. 340/598; 340/635; 361/106
[58] Field of Search ............... 340/598, 595, 584, 635; 361/106; 307/117

[56] References Cited

U.S. PATENT DOCUMENTS 3,840,834  10/1974  Obenhaus et al. .................. 361/106
3,872,355   3/1975  Klein et al. ......................... 340/595
4,238,812  12/1980  Middleman et al. ................ 361/106

*Primary Examiner*—Glen R. Swann, III
*Attorney, Agent, or Firm*—Marvin Snyder; James C. Davis

[57] ABSTRACT

Temperature indicating apparatus for sensing overheating at a pair of terminals on an electrical power line comprises a neon gas-filled glow tube and a thermistor electrically coupled in series across the terminals, with a resistor electrically coupled in parallel with the glow tube. The thermistor is thermally coupled to the terminations so that an excessive temperature rise at either terminal decreases the thermistor resistance to a level at which sufficient voltage appears across the glow tube to ignite the glow tube and provide a visual indication of overheating. The circuit readily lends itself to a plug-in type configuration if the terminals to be monitored are in a duplex receptacle, or to employment in a cube tap.

30 Claims, 6 Drawing Figures

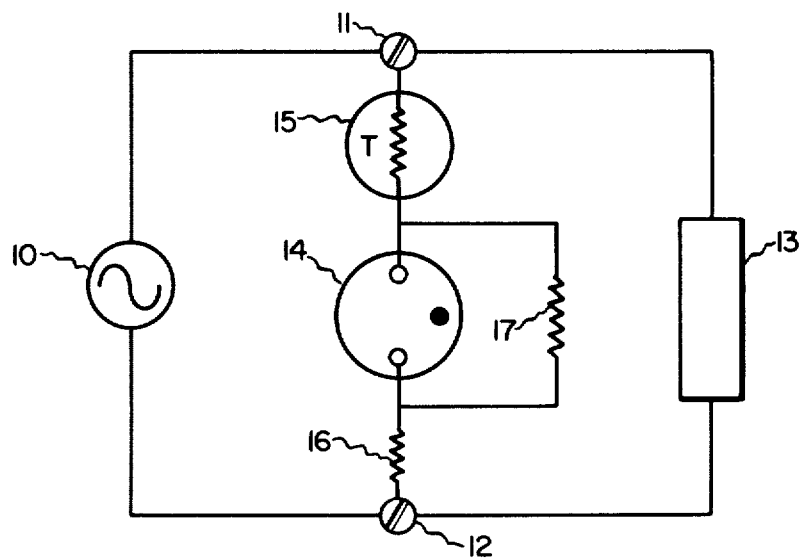
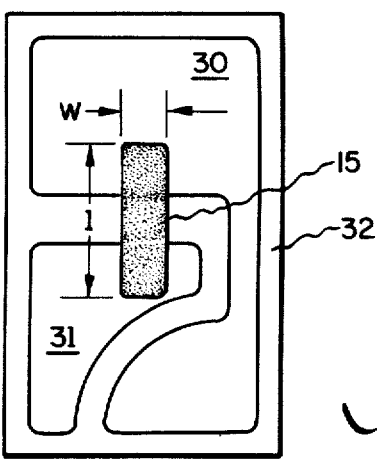
Fig. 1
Fig. 2
Fig. 3

ELECTRICAL DEVICE TERMINATION HIGH TEMPERATURE INDICATOR

INTRODUCTION

This invention relates to electrical test apparatus, and more particularly to a low cost indicator of excessive temperature at the terminals of an electrical device.

Most items of electrical apparatus intended for operation from commercial power sources characteristically employ terminations for the wiring that supply them with power. For proper and safe operation, these items of electrical apparatus must be wired correctly at their terminations. An improperly terminated conductor, whether the termination be the contacting blade surfaces of a plug-in type connection or a terminal contacting a stranded or solid conductor, may overheat at such termination when carrying current, bringing with it the hazard of damaging any combustible material that may happen to be in contact with the overheated terminal. If detected early, however, this hazard can be overcome by correcting the wiring which brought it about. Therefore, it would be desirable to provide a simple, low cost temperature sensor that can reliably provide a warning of potential hazard due to electrical wiring overheating. In the event the terminations which might be subject to overheating are located within a junction box housing a duplex receptacle, it would be convenient to employ such sensor in a form which readily lends itself to being plugged into the receptacle. Alternatively, if the terminations to be monitored are located in a cube tap, the sensor may conveniently be built into the tap as an integral portion thereof.

Accordingly, one objective of the invention is to provide low cost apparatus for sensing overheating of current-carrying electrical conductors.

Another object is to provide apparatus for reliably identifying improper termination of electrical conductors without need for any power supply other than the line voltage.

Another object is to provide a cube tap which signals an indication of overheating therein.

Another object is to provide a plug-in type device for sensing overheating of a duplex receptacle.

Briefly, in accordance with a preferred embodiment of the invention, a high temperature indicator for an electrical power circuit connected to a pair of terminations comprises on/off indicating means and a thermistor coupled in series across the terminations. Resistance means coupled in parallel with the indicating means forms a voltage divider network with the thermistor so that as long as the thermistor is at room temperature, the voltage divider network maintains the voltage across the indicating means at a level below which the indicating means produces an overheating signal.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

FIG. 1 is a schematic diagram of one embodiment of the invention, shown connected across terminations supplying power to a load circuit;

FIG. 2 is a part sectional and part schematic view of a self-contained device employing a thermistor to sense overheating in a duplex receptacle;

FIG. 3 is a plan view of a printed circuit element carrying the thermistor shown in FIG. 2;

DESCRIPTION OF PREFERRED EMBODIMENTS

Figure 4:
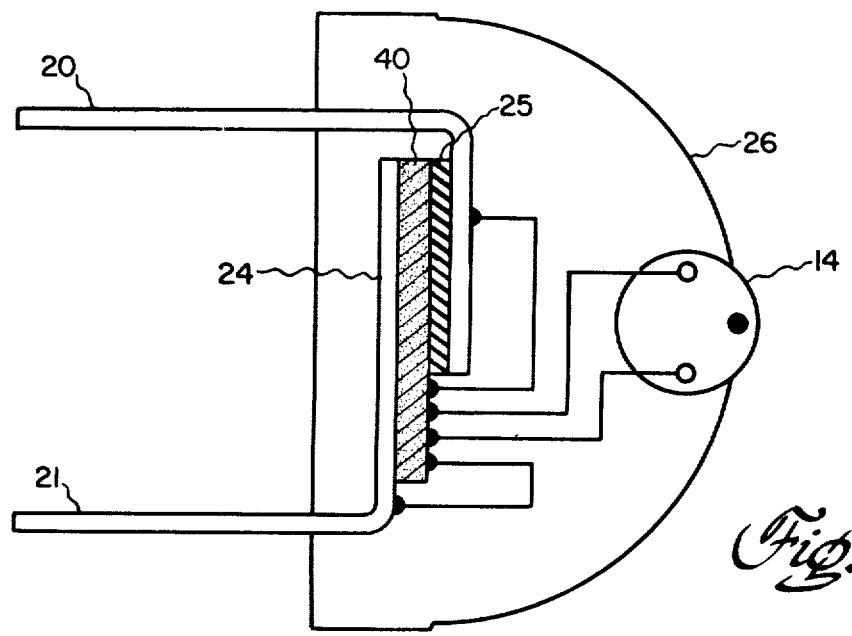
FIG. 4 is a section view of the invention fabricated in the form of a plug-in type device to sense overheating in a duplex receptacle.

FIG. 1 illustrates the circuit embodying the instant invention. A power source 10, such as the conventional 110–120 volt, 60 hertz, AC type common in the United States, is connected to a load 13 through a pair of terminations 11 and 12. In many instances, these terminations are of the screw-down terminals type which contact the wires with a compressive force. In the majority of such instances, the contact is properly terminated and provides a path of very low resistance for the load current, so that overheating is not likely to occur. In those few instances where the contact is not properly terminated, however, a path of much higher resistance may be presented to the load current as where, for example, an insufficient number of strands in the wire make contact with the terminal because they were cut too short or are bent away from the terminal, or where some amount of insulation exists between the terminal and the wire. The high resistance path, if carrying sufficient current, may undergo a large temperature rise because of the power loss occuring therein. The temperature thus reached conceivably could exceed the safe temperature of many combustible materials which, if in contact with the wire or termination in the region of high power loss, might be damaged. To provide warning of the resulting safety hazard, an on/off indicator, typically a neon gas-filled glow tube 14, is connected in series with a thermistor 15 (that is, a device exhibiting a negative temperature coefficient of resistance) and a current limiting resistor 16 across power terminals 11 and 12. Thermistor 15 is situated sufficiently close to terminals 11 and 12 as to be thermally responsive (or thermally coupled) thereto. A resistor 17 is connected in parallel with the glow tube so as to maintain the voltage across glow tube 14 at a level below its ignition voltage as long as thermistor 15 is at room temperature (typically below about 40° C.). In the alternative, device 14 may conveniently comprise a liquid crystal display. As temperature of the wiring and/or other metallic portions of the conducting paths rises above room temperature levels, however, the thermistor resistance decreases to a level which causes the voltage drop across resistor 17 to exceed the firing potential of glow tube 14. The glow tube thereupon becomes lit (or, in the case of a liquid crystal display, a predetermined visual display is provided), indicating that the thermistor has reached an abnormally high temperature, thereby signifying that the wiring at either or both of terminations 11 and 12 is overheated. Corrective action can then be taken in order to eliminate the potential for a dangerous fire to occur.

In order to ensure reliable indication of overheating, vanadium oxide is employed as a preferred material for thermistor 15. Thermistors comprised of this material, such as that sold by E.I. DuPont de Nemours and Company under the trademark Tyox, type 101T, exhibit a very rapid resistance change of 3 or 4 orders of magnitude when going through the phase change temperature (or temperature at which resistance of thermistor 15 changes very sharply with small temperature variations) of 67° C., going from 1–10 megohms at room temperature down to 10–30 kilohms at temperatures above 67° C. (Several other vanadium oxide thermistor products would, alternatively, be satisfactory for use in the instant invention. Such products may be obtained, for example, from Hitachi, Ltd., Canadian Thermostats and Control Devices, Ltd., and other suppliers.) Resistor 16 serves to limit the maximum current through the thermistor and glow lamp combination, preventing them from burning out when a severely overheating termination is encountered. Resistor 17, by forming a voltage divider with thermistor 15 (and the relatively small resistor 16) maintains the voltage across glow lamp 14 below approximately 50 volts at room temperature.

FIG. 2 illustrates a high temperature indicating device incorporating the circuitry of FIG. 1, with like reference numbers designating like components. In the circuitry of FIG. 2, however, prongs 20 and 21 are substituted for terminals 12 and 11, respectively, of FIG. 1. The device senses the temperature of prongs 20 and 21 when they are inserted into a duplex receptacle desired to be monitored for overheating. By placing between extensions 23 and 24 of prongs 20 and 21, respectively, the temperature sensitive apparatus comprising thermistor 15 of the type described in conjunction with the apparatus of FIG. 1 but formed on a high thermal conductivity substrate 32, and by employing a pad 25 of thermally conducting silicone rubber (such as, for example, type COHR 500 silicone rubber sheet available from Connecticut Hard Rubber Company, New Haven, Conn.) between prong extension 23 and thermistor 15 (as supported on substrate 32), thermistor 15 will respond essentially to the average temperature of prongs 20 and 21 at their respective extensions 23 and 24. The entire assembly may be supported by a single piece 26 of plastic or nylon into which it is molded. Thus all components of the circuit are surrounded and enclosed by supporting means 26 with the exceptions of a portion of glow tube 14 which is exposed for visual observation and a portion of prongs 20 and 21 which protrude from supporting means 26 so as to permit their insertion into a duplex receptacle.

Thermistor 15, in the embodiment of FIG. 2, may be printed on substrate 32, typically comprised of alumina, in order to achieve high thermal conductivity to the thermistor through the substrate. This has the added advantage of allowing resistors 16 and 17 to be printed on the same substrate, if desired, thereby simplifying manufacture of the high temperature indicating device and achieving a more compact size as well. The resulting structure would appear as illustrated in FIG. 4, wherein like components are represented by like reference numbers. In the embodiment of FIG. 4, a printed circuit 40 contains thermistor 15 and resistors 16 and 17, connected as shown in FIG. 1 and, while the thermistor and resistors are not specifically identified, they will be understood to be supported on an alumina substrate for printed circuit 40 situated between prong extension 24 and silicone rubber pad 25.

FIG. 3 illustrates a simple arrangement wherein substrate 32, described in conjunction with the apparatus shown in FIG. 2, employs two conductor pads 30 and 31 thereon, and a printed thermistor element 15 connected between the two pads. Thermistor element 15 exhibits a width w and length l. By increasing the length l of element 15, its "off" state impedance (i.e., its impedance when the neon glow tube is off) and "on" state impedance (i.e., its impedance when the neon glow tube is lit) can both be increased. By increasing the width w of element 15, its "off" state impedance and "on" state impedance can both be decreased. Moreover, both of the sensor terminals can be brought to a common end of sensor substrate 32 so that prong 20 extension 23, shown in FIG. 2, can overlap directly above temperature sensing thermistor 15 while leads are brought out beyond where prong 20 extension 23 overlaps thermistor 15. This endows the thermistor with high sensitivity to the temperature of prong 20 without substantially diminishing its electrical isolation therefrom. Thus by employing a printed circuit thermistor 15 on an alumina substrate 32, not only is good thermal coupling to prong 21 achieved, but the silicone rubber electrical isolation between thermistor 15 and prong 20 still allows good thermal coupling therebetween. By potting the entire assembly in a plastic or nylon enclosure 26, such as shown in FIG. 2, mechanical integrity of the system is readily maintained.

Figure 5:
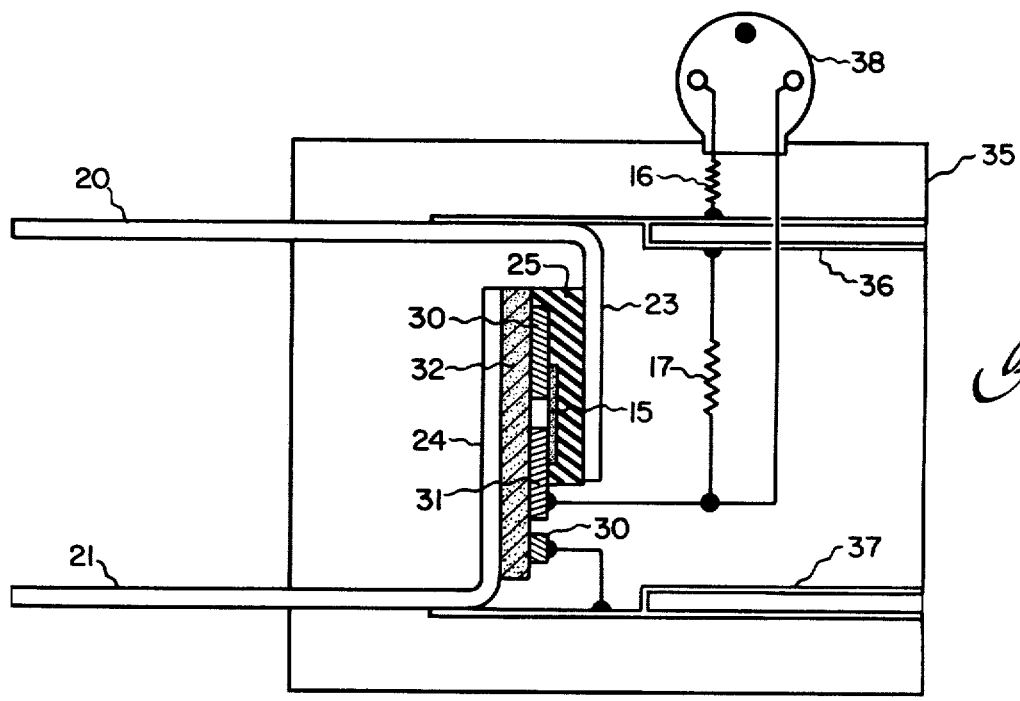
FIG. 5 is a schematic diagram of another embodiment of the invention, shown connnected across terminations supplying power to a load circuit.

FIG. 5 illustrates a cube tap which provides a visual indication of overheating therein, and which includes the circuitry of FIG. 1, with like reference numbers designating like components. In the circuitry of FIG. 5, however, prongs 20 and 21 are substituted for terminals 12 and 11, respectively, of FIG. 1, in a manner similar to that shown and described in conjunction with the embodiment of FIG. 2. The cube tap of FIG. 5 includes female connectors 36 and 37 joined to prongs 20 and 21, respectively. A gas discharge tube 38 is employed to provide visual indications of overheating, and is electrically connected in the same manner as glow tube 14 in the circuit of FIG. 1. The entire assembly may be supported by a single piece 35 of plastic or nylon into which it is molded. Thus all components of the circuit are surrounded and enclosed by supporting means 35 with the exceptions of gas discharge tube 38, which is exposed for visual observation, and a portion of prongs 20 and 21, which protrude from supporting means 35 so as to facilitate their insertion into a duplex receptacle. Although only one pair of female connectors are illustrated in the cube tap, common practice is to employ three pairs of such connectors and it will be understood by those skilled in the art that the instant invention may be employed irrespective of the number of pairs of female connectors situated in the cube tap.

As in the structure illustrated in FIG. 2, thermistor 15 may be printed on substrate 32 in order to achieve high thermal conductivity to the thermistor through the substrate. This provides the additional benefit of allowing resistors 16 and 17 to be printed on the same substrate, if desired.

In the event poor contact exists between any pair of female connectors 36 and 37 and the prongs of a male plug (not shown) situated therein and connected to a load, overheating may occur within the cube tap. Alternatively, overheating may occur if excessive loads are connected to the cube tap. In either event, overheating of the cube tap is sensed by the temperature-sensitive circuitry therein, and energizes display 38, in the manner previously described, to provide the user with a visual indication of excessive cube tap temperature.

Figure 6:
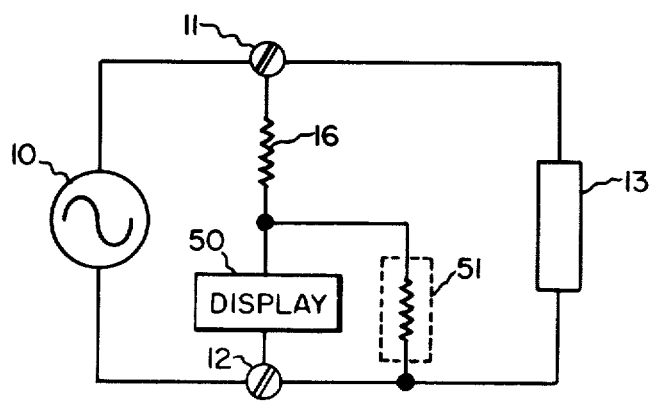
FIG. 6 is a part sectional and part schematic view of a cube tap employing a thermistor to sense overheating within the tap.

The apparatus described heretofore in conjunction with FIGS. 1–5 all employ a negative temperature coefficient device, i.e., thermistor 15. In an altenative embodiment, however, a positive temperature coefficient of resistance device may be employed, as illustrated in FIG. 6, connected between terminals 11 and 12 shown in FIG. 1 and thermally responsive thereto. Thus a display device 50, which may comprise a gas discharge tube or a liquid crystal display, for example, is connected in series with current limiting resistor 16 across terminations 11 and 12. A positive temperature coefficient of resistance device 51, such as a barium titanate ceramic, or a phase change positive temperature coefficient switch of the type sold by Raychem Corporation under the trademark Polyswitch, is connected across display device 50. The resistance of positive temperature coefficient of resistance device 51 is selected so that, at room temperature, it is sufficiently low to keep the voltage across display device 50 below its ignition or display threshold. The entire device can be fabricated inside a plastic or nylon supporting means in the manner described in conjunction with the apparatus shown in FIGS. 2, 4 or 5.

As temperature of the wiring and/or other metallic portions of the conducting paths rises above room temperature levels, however, the resistance of positive temperature coefficient of resistance device 51 rises to a level which causes the voltage drop across display device 50 to exceed its ignition or display threshold. The display device thereupon provides a visual indication that the wiring at either or both of terminations 11 and 12 is overheated, allowing corrective action to be taken early, befroe any damage occurs.

While the instant invention has been described with respect to using a neon glow lamp or liquid crystal display for the overtemperature indication, it is also possible to use a small piezoelectric sounder to produce an audible alarm on overtemperature. Alternatively, it is also feasible to drive a high impedance coil in an electromagnetic sounder using the technique described herein, or to drive any of a variety of other outputs such as relays, thyristors, and transistors. Finally, the invention is not limited to any particular voltage (as long as there is sufficient voltage to ignite the glow tube or drive the liquid crystal display or whatever other indicator device may be employed) and hence can be used on 220–240 volt electrical systems, at AC frequencies other than 60 hertz, and can be used in DC electrical systems also.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

We claim:

1. A high temperature indicator for an electrical power circuit connected to at least one termination, comprising:
   on/off indicating means;
   a thermistor electrically coupled in series with said indicating means across said power circuit, said thermistor being thermally coupled to said termination, and
   resistance means electrically coupled in parallel with said indicating means.

2. The apparatus of claim 1 wherein said indicating means comprises a gas-filled glow tube.

3. The apparatus of claim 1 wherein said thermistor comprises vanadium oxide.

4. The apparatus of claim 2 wherein said thermistor comprises vanadium oxide.

5. The apparatus of claim 2 including current limiting resistance means electrically coupled in series with said gas-filled glow tube.

6. The apparatus of claim 3 including current limiting resistance means electrically coupled in series with said gas-filled glow tube.

7. A high temperature indicator for an electrical power circuit connected to a pair of terminations, comprising:
   on/off indicating means;
   a thermistor electrically coupled in series with said indicating means and adapted to be connected across said power circuit, said thermistor being adapted to be thermally coupled to at least one of said terminations;
   resistance means electrically coupled in parallel with said indicating means; and
   supporting means surrounding and enclosing said thermistor, said resistance means, and a portion of said indicating means, so as to provide structural rigidity thereto.

8. The apparatus of claim 7 wherein said indicating means comprises a gas-filled glow tube.

9. The apparatus of claim 7 wherein said thermistor comprises vanadium oxide.

10. The apparatus of claim 8 wherein said thermistor comprises vanadium oxide.

11. The apparatus of claim 7 including a pair of prongs protruding from said supporting means and adapted to be inserted into a duplex receptacle, said indicating means and said thermistor being electrically coupled in series across said prongs, and said thermistor being thermally coupled to at least one of said prongs.

12. The apparatus of claim 11 wherein said indicating means comprises a neon gas-filled glow tube.

13. The apparatus of claim 11 wherein said thermistor comprises vanadium oxide.

14. The apparatus of claim 12 wherein said thermistor comprises vanadium oxide.

15. The apparatus of claim 11 including at least one pair of female connectors electrically connected to said pair of prongs, respectively.

16. The apparatus of claim 15 wherein said indicating means comprises a gas discharge tube.

17. The apparatus of claim 15 wherein said thermistor comprises vanadium oxide.

18. The apparatus of claim 16 wherein said thermistor comprises vanadium oxide.

19. The apparatus of claim 7 including a pair of prongs protruding from said supporting means and adapted to be inserted into a duplex receptacle, said indicating means and said thermistor being electrically coupled in series across said prongs; a thermally conductive substrate supporting said thermistor, said substrate being in thermal contact with one of said prongs; and thermally conductive electrically insulating means being in thermal contact with said thermistor and the other one of said prongs.

20. The apparatus of claim 19 wherein said indicating means comprises a neon gas-filled glow tube.

21. The apparatus of claim 19 wherein said thermistor comprises vanadium oxide.

22. The apparatus of claim 20 wherein said thermistor comprises vanadium oxide.

23. The apparatus of claim 19 including resistance means electrically coupled in series with said indicating means and contained within said supporting means.

24. The apparatus of claim 20 including resistance means electrically coupled in series with said neon gas-filled glow tube and contained within said supporting means.

25. The apparatus of claim 19 wherein each of said prongs includes a respective extension thermally coupled to said thermistor, each of said extensions extending substantially parallel to said substrate, said one of said extensions passing completely under said thermistor and said other one of said prongs passing completely over said thermistor.

26. The apparatus of claim 25 wherein said indicating means comprises a neon gas-filled glow tube.

27. The apparatus of claim 25 wherein said thermistor comprises vanadium oxide.

28. The apparatus of claim 26 wherein said thermistor comprises vanadium oxide.

29. A high temperature indicator for an electrical power circuit connected to at least one termination, comprising:
on/off indicating means;
resistance means electrically coupled in series with said indicating means across said power circuit; and
a positive temperature coefficient of resistance device coupled in parallel with said indicating means and being thermally coupled to said termination.

30. The apparatus of claim 29 wherein said indicating means comprises a gas-filled glow tube.

* * * * *